United States Patent
Sowa et al.

(10) Patent No.: US 10,351,950 B2
(45) Date of Patent: Jul. 16, 2019

(54) PLASMA ENHANCED ALD SYSTEM

(71) Applicant: Ultratech, Inc., San Jose, CA (US)

(72) Inventors: Mark Sowa, Medford, MA (US); Robert Kane, Wakefield, MA (US); Michael Sershen, Cambridge, MA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 15/033,071

(22) PCT Filed: Nov. 21, 2014

(86) PCT No.: PCT/US2014/066916
§ 371 (c)(1),
(2) Date: Apr. 28, 2016

(87) PCT Pub. No.: WO2015/080979
PCT Pub. Date: Jun. 4, 2015

(65) Prior Publication Data
US 2016/0281223 A1    Sep. 29, 2016

Related U.S. Application Data

(60) Provisional application No. 61/909,121, filed on Nov. 26, 2013.

(51) Int. Cl.
*C23C 16/44* (2006.01)
*C23C 16/455* (2006.01)
(Continued)

(52) U.S. Cl.
CPC .... *C23C 16/4412* (2013.01); *C23C 16/45527* (2013.01); *C23C 16/45536* (2013.01);
(Continued)

(58) Field of Classification Search
CPC .......... C23C 16/4412; C23C 16/45527; C23C 16/45536; C23C 16/45542; C23C 16/45544; C23C 16/50; C23C 16/52
See application file for complete search history.

(56) References Cited

U.S. PATENT DOCUMENTS 5,704,214 A   1/1998  Fujikawa et al.
6,099,649 A   8/2000  Schmitt et al.
(Continued)

FOREIGN PATENT DOCUMENTS

EP    0847789 A1    6/1998
JP    2004-305950 A    11/2004
(Continued)

OTHER PUBLICATIONS

FI Application No. 20165435 Search Report, dated May 30, 2017.
(Continued)

*Primary Examiner* — Kelly M Gambetta
(74) *Attorney, Agent, or Firm* — Royse Law Firm, PC

(57) ABSTRACT

An improved Plasma Enhanced Atomic Layer Deposition (PEALD) system and related operating methods are disclosed. A vacuum reaction chamber includes a vacuum system that separates a first outflow from the reaction chamber, comprising unreacted first precursor, from a second outflow from the reaction chamber, comprising second precursor and any reaction by products from the reaction of the second precursor with the coating surfaces. A trap, including trap material surfaces, is provided to remove first precursor from the first outflow when the first precursor reacts with the trap material surfaces. When the second precursor includes a plasma generated material, the second precursor is not passed through the trap. An alternate second precursor source injects a suitable second precursor into the trap to complete a material deposition layer onto the trap
(Continued)

surfaces thereby preparing the trap material surfaces to react with the first precursor on the next material deposition cycle.

10 Claims, 1 Drawing Sheet

(51) Int. Cl.
    *H01J 37/32*     (2006.01)
    *C23C 16/50*     (2006.01)
    *C23C 16/52*     (2006.01)

(52) U.S. Cl.
    CPC .. *C23C 16/45542* (2013.01); *C23C 16/45544* (2013.01); *C23C 16/50* (2013.01); *C23C 16/52* (2013.01); *H01J 37/32449* (2013.01); *H01J 37/32834* (2013.01)

(56) References Cited

U.S. PATENT DOCUMENTS

| | | | |
|---|---|---|---|
| 6,354,241 B1 | 3/2002 | Tanaka et al. | |
| 8,202,575 B2 | 6/2012 | Monsma et al. | |
| 2001/0017080 A1 | 8/2001 | Dozoretz et al. | |
| 2004/0250765 A1 | 12/2004 | Ishizaka et al. | |
| 2006/0021573 A1* | 2/2006 | Monsma | C23C 16/44 118/715 |
| 2006/0180026 A1 | 8/2006 | Gu | |
| 2006/0264045 A1 | 11/2006 | Gu | |
| 2006/0276049 A1 | 12/2006 | Bailey et al. | |
| 2008/0286075 A1 | 11/2008 | Horii | |
| 2009/0191109 A1* | 7/2009 | Tsuda | C23C 16/34 423/240 R |
| 2010/0183825 A1* | 7/2010 | Becker | C23C 16/4404 427/569 |

FOREIGN PATENT DOCUMENTS

| | | |
|---|---|---|
| JP | 2010-018889 A | 1/2010 |
| JP | 2010-141248 A | 6/2010 |
| JP | 2011-181681 A | 9/2011 |
| JP | 2012-126977 A | 5/2012 |
| JP | 2012-126977 A | 7/2012 |
| WO | 99/32686 A1 | 7/1999 |
| WO | 2004/094694 A | 11/2004 |
| WO | 2006/127693 A2 | 11/2006 |
| WO | 2011/026064 A1 | 3/2011 |

OTHER PUBLICATIONS

TW Application No. 103140214, Search Report, dated Oct. 14, 2016.
TW Application No. 103140214, Amendment Filed, Amended Specification and Translation of Amended Specification, Filed Jan. 13, 2017.
SG Application No. 11201603347W, Response Filed Mar. 27, 2017.
KR Application No. 2016-7013788, Rejection dated Nov. 21, 2016.
KR Application No. 2016-7013788, Response Filed Jan. 17, 2017.
GB Application No. 1607549.1, Examination Report Jun. 13, 2017.
GB Application No. 1607549.1, Response Filed Aug. 4, 2017.
JP Application No. 2016-534194, Notification of Reasons for Refusal, dated May 31, 2017.
JP Application No. 2016-534194, Amendment and Argument, Filed Jul. 11, 2017.
SG Application No. 11201603347W, Written Opinion, dated Feb. 28, 2017.
PCT/US2014/066916, ISR and WO, dated Mar. 17, 2015.
FI 20165435 3rd Party Observation, made available by the Finnish Patent Office Jan. 29, 2018.
DE Application No. 11 2014 005 386.4, Translation of Office Action dated Apr. 19, 2018.
DE Application No. 11 2014 005 386.4, Examination Report dated Apr. 19, 2018.
FI 20165435 Response dated Apr. 6, 2018 Office Action, Dated Jun. 28, 2018.
Finland Patent Application 20165435, Third Party Opposition dated Sep. 20, 2018.
FI 20165435 Office Action dated Nov. 28, 2018.
FI 20165435 Response dated Office Action dated Nov. 28, 2018, Filed Mar. 13, 2019.

* cited by examiner

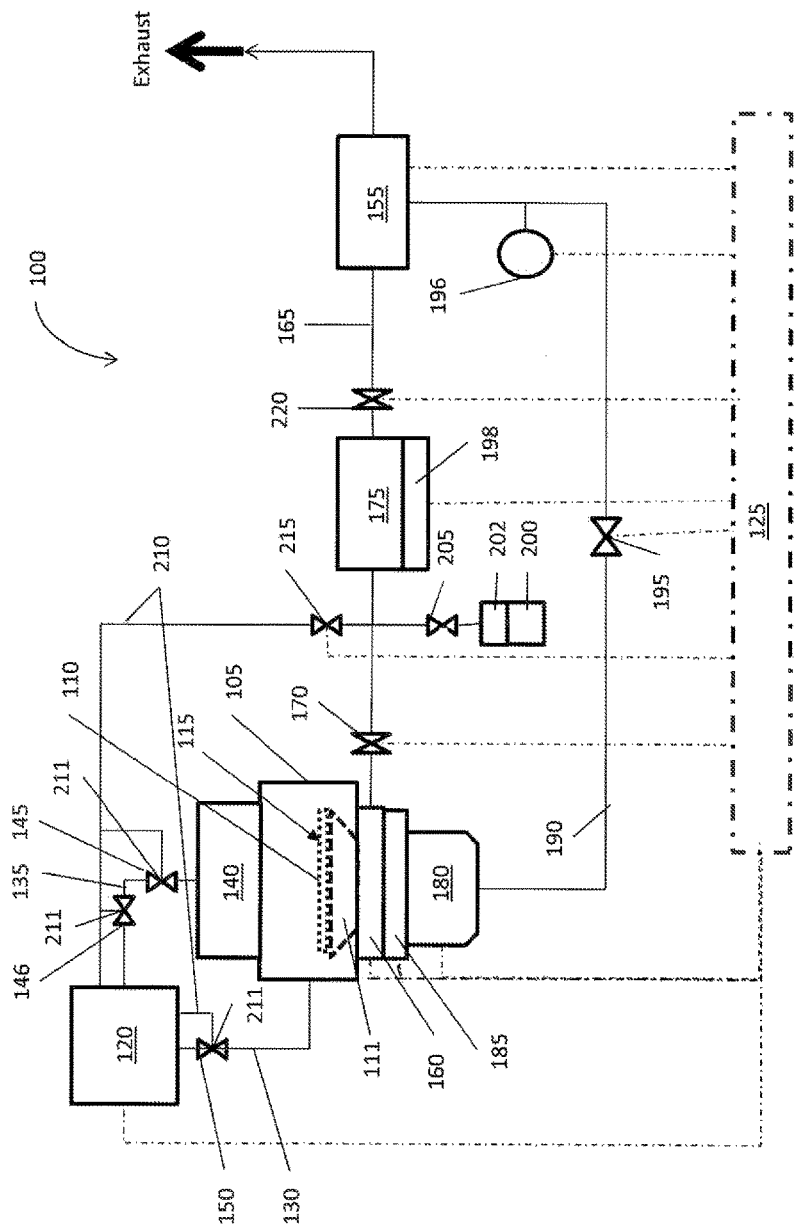

PLASMA ENHANCED ALD SYSTEM

BACKGROUND OF THE INVENTION

Field of the Invention

The present invention relates to a gas deposition system configured to perform Plasma Enhanced Atomic Layer Deposition (PEALD) gas deposition cycles usable to deposit thin film material layers onto exposed surfaces of a solid substrate. In particular the PEALD system includes a reaction chamber, a main vacuum pump for establishing a first vacuum pressure in the reaction chamber during non-plasma precursor deposition cycles and a second vacuum pump for establishing a second lower vacuum pressure in the reaction chamber during plasma precursor deposition cycles.

The Related Art

Conventional ALD and Precursor Trapping

Conventional Atomic Layer Deposition (ALD) systems operate as a gas or vapor deposition system usable to deposit thin film material layers onto exposed surfaces of one or more substrates. More specifically Atomic Layer Deposition (ALD) is a thin film deposition technique which proceeds via sequential exposure of the deposition substrates with multiple, distinct chemical and/or energetic environments. A typical process would proceed with the introduction of a vapor phase metal-atom containing precursor which would chemisorb with preexisting chemical moieties on the substrate surface. Following a purge cycle to remove excess precursor and reaction products, a second precursor is introduced into the reactor which is reactive with the chemisorbed portion of the first reactant. A second purge cycle removes excess precursor and reaction products. For a successful ALD process, the second precursor cycle leaves the substrate surface again ready for another exposure of the first precursor. Sequentially exposing the surface to: precursor 1, purge, precursor 2, purge, repeat, enables a conformal film to be deposited with sub-atomic layer thickness control.

In operation substrates are placed inside a substantially sealed reaction chamber which is generally evacuated to low deposition pressure e.g. 0.1 to 10 militorr and heated to a reaction temperature, e.g. between 75 and 750° C. A first precursor or reactant is introduced into the reaction space to react with exposed surfaces or coating surfaces of the substrate. An inert carrier gas may be mixed with the first precursor during the delivery of the first precursor. After a desired exposure time, the first precursor is then removed or purged from the reaction chamber. The purge cycle generally includes drawing gas from the reaction chamber through an exit port in fluid communication with a vacuum pump. Thereafter a second precursor or reactant is introduced into the reaction space to react with exposed surfaces of the substrate coating surface for a desired exposure time. An inert carrier gas may be mixed with the second precursor during the delivery of the second precursor. The second precursor is then removed or purged from the reaction chamber through the exit port as described above. Generally the above described two precursor coating cycle applies a single material thickness layer onto the exposed surfaces with the layer thickness in the range of 0.5 to about 2.0 Å. Typically the two precursor coating cycle is repeated to apply a plurality of single material thickness layers one above another to achieve a desired material thickness.

Conventional ALD systems include a trap disposed between the exit port and the vacuum pump. The trap removes unreacted precursor from the outflow to avoid damaging the vacuum pump. In particular without a trap, the same two precursor coating cycles used to apply material layers onto exposed surfaces of the substrate housed inside the reaction chamber can combine to form the same thin film material layer onto internal surfaces of exhaust conduits and the vacuum pump, ultimately leading to undesirable surface contamination and eventual vacuum pump failure. While various trap mechanisms are known for removing unreacted precursors and reaction by-products from the outflow of gas or vapor deposition systems one particularly useful trapping mechanism conventionally used in ALD system is to provide a large surface area of heated metal plates inside a trap chamber for the precursors to react with as they pass through the trap chamber. One such trap is disclosed in U.S. Pat. No. 8,202,575 B2, granted to Monsma et al. on Jun. 19, 2012 entitled VAPOR DEPOSITION SYSTEMS AND METHODS. In that disclosure, Monsma et al. describe an ALD reaction chamber, a trap and a vacuum pump in series wherein outflow from the reaction chamber passes through the trap prior to being drawn through vacuum pump. The trap is specifically configured to provide a small gas flow resistance and high vacuum conductance while allowing the same deposition process to occur on metal surfaces provided inside the trap as occurs on the exposed surfaces of the substrate being coated inside the reaction chamber. Additionally Monsma et al. indicate that it is desirable to provide a trap material with a similar thermal expansion coefficient as the deposited materials to prevent the coating layer being formed on surfaces of the trap material from cracking or flacking and being carried into the vacuum pump. However one problem with the trap system proposed by Monsma et al. is that in order for the trap materials to react with precursors in the outflow, both precursors must be available to participate in the reaction with the trap material surfaces and if both precursors are not available in the outflow the ALD reaction inside the trap fails to form material layers and the operation of the trap breaks down and unreacted precursor materials are passed to the vacuum pump.

Conventional PEALD and Precursor Trapping

Conventional Plasma Enhanced Atomic Layer Deposition (PEALD) systems operate as a gas or vapor deposition system usable to deposit thin film material layers onto exposed surface of one or more substrates. In operation, substrates are placed inside a substantially sealed reaction chamber which is generally evacuated to low deposition pressure e.g. 0.1 to 10 millitorr and heated to a reaction temperature, e.g. between 75 and 750° C. A first precursor or reactant, e.g. a molecular chemical such as a vapor phase metal-atom containing molecule, is introduced into the reaction space as a vapor to react with exposed surfaces of the substrate coating surface. An inert carrier gas may be mixed with the first precursor during the delivery of the first precursor. After a desired exposure time, the first precursor is then removed or purged from the reaction chamber. The purge cycle generally include drawing gas from the reaction chamber through an exit port in fluid communication with a vacuum pump. Thereafter a second precursor or reactant comprising a flux of radicals generated through dissociation of a molecular gas feed by a plasma source or other radical generating technique is introduced into the reaction space to react with exposed surfaces of the substrate coating surface.

In the PEALD systems the second precursor comprises free radicals generated by exciting a gas precursor to a plasma state or by other radical generating techniques. In particular, molecular gases such as oxygen, nitrogen, hydrogen and other molecular gases or gas mixtures are excited by a plasma generator and a flux of free radicals is delivered into the reaction chamber to react with the exposed surfaces of the substrate. The free radicals include one or more atoms or atomic groups having one or more free electrons so radicals are very reactive, but their lifetimes tend to be short since they are expected to recombine to relatively inert molecular species quickly.

As with conventional ALD systems, an inert carrier gas may be mixed with the plasma precursor during its delivery. The second precursor is then removed or purged from the reaction chamber through the exit port as described above. Generally the above described two precursor plasma coating cycle applies a single material thickness layer onto the exposed surfaces of a substrates disposed inside the reaction chamber with the single layer material thickness in the range of 0.5 to about 2.0 Å. Typically the two precursor cycle is repeated to apply a plurality of single material thickness layers one above another to achieve a desired material thickness.

An example of a conventional PEALD system is disclosed in US20100183825A1, by Becker et al. published on Jul. 22, 2010, entitled PLASMA ATOMIC LAYER DEPOSITION SYSTEM AND METHOD. In that disclosure Becker et al. describe a plasma reaction chamber that includes a first precursor port for introducing non-plasma precursors into the reaction chamber and a second precursor port or top aperture that introduces plasma exited precursor materials into the reaction chamber. Becker et al. disclose a vacuum system in FIG. 10 which includes a turbo vacuum pump operating to remove outflow from the reaction chamber through a trap assembly shown in FIG. 6. The disclosure describes the trap assembly as heated to react with precursor and or plasma gases in gas outflow exiting from the gas deposition chamber. The reaction between exposed trap material surfaces disposed inside the trap and any remaining unreacted precursor vapor and or unreacted plasma radicals from the outflow removes unreacted precursor from the outflow and deposits the same material onto exposed trap material surfaces as is deposited onto the substrate inside the reaction chamber.

Free Radical Decay

However one problem with the PEALD system proposed by Becker et al. relates to high reactivity and rapid decay of the plasma excited precursor radicals to a non-excited state and these factors affect system operation in two ways. In a first related problem, the free radicals of plasma precursor may decay to a non-excited state or react with other surfaces inside the reaction chamber before reacting with exposed surfaces of the substrate being coated. As a result the desired self-limiting ALD reaction expected to occur inside the reaction chamber may not continue to completion due to lack of plasma radicals at the exposed surfaces such that the exposed surfaces of the substrate are not fully coated.

In a second related problem the free radicals of the plasma precursor may decay to a non-excited state or react with other surfaces inside the reaction chamber before reacting exposed trap material surfaces inside the trap. As a result the same desired self-limiting ALD reaction with the trap materials used to remove unreacted precursors from the outflow may not continue to completion such that the exposed surfaces inside the trap are not fully coated which ultimately leads to the breakdown of any reaction of the first and second precursor with exposed surfaces inside the trap.

BRIEF SUMMARY OF THE INVENTION

In view of the problems associated with conventional methods and apparatus set forth above the present invention provides various operating methods for an atomic layer deposition system that utilizes plasma or otherwise generated free radicals to react with coating surfaces.

Specifically each deposition includes performing a plurality of material deposition coating cycles of one or more substrates contained in a reaction chamber. During each deposition cycle a first precursor is delivered into the reaction chamber to react with exposed surfaces of the one or more substrates and the reaction chamber is purged by removing the first outflow from the reaction chamber with the first outflow including unreacted first precursor. The first outflow also includes inert gas and reaction byproducts. The first outflow is then passed through a trap. The trap includes a large area of trap material surfaces suitable for reacting with the unreacted first precursor. However since a second precursor delivered into the reaction chamber is free radicals that will likely decay to an unexcited state before reacting with the trap material surfaces, a second alternate precursor source is provided and passed through the trap. The alternate second precursor is suitable to react with the trap material surfaces in a manner that completes rendering the trap material surfaces to be able to react with and remove unreacted first precursor from the first outflow of a next coating cycle. Specifically the alternate second precursor is a separate precursor source and is not withdrawn from the reaction chamber. In addition since the reaction between the first precursor and the exposed surfaces inside the reaction chamber occurs at a particular reaction temperature the operating method further includes maintaining the trap material surfaces at the reaction temperature.

In subsequent steps, after removing the first outflow from the reaction chamber, a second precursor comprising free radicals is delivered into the reaction chamber to react with the exposed substrate surfaces. Thereafter the second outflow is removed from the reaction chamber, however, the second outflow is not passed through the trap.

An atomic layer deposition device usable for the above described methods includes a reaction chamber configured to support one or more substrates therein for deposition material cycles. A first precursor conduit delivers a first precursor into the reaction chamber to react with exposed surfaces of the substrate. A vacuum system is provided to purge or remove a first outflow that includes unreacted first precursor from the reaction chamber. The first outflow is removed after a desired exposer time between the first precursor and the substrate surfaces which may be as short as the time required to remove one or two gas volumes equal to the volume of the reaction chamber or longer.

A trap comprising trap material surfaces is disposed to receive the first outflow through the trap. The trap material surfaces are suitable to react with and remove substantially all of the unreacted first precursor from the first outflow. An alternate second precursor source is provided to deliver an alternate second precursor into the trap. The alternate second precursor is a precursor material suitable for reacting with the trap material surfaces in a manner that completes the reaction stated by the first precursor to form a material layer onto the trap material surfaces while also preparing the trap material surfaces to react with the first precursor on the next deposition cycle. The trap includes a heater for heating the reaction surfaces to a desired reaction temperature.

A second precursor conduit is provided to deliver a second precursor into the reaction chamber to react with the exposed surfaces of the substrate after the exposed surfaces have reacted with the first precursor. A plasma generator is associated with the second precursor conduit to excite the second precursor to generate free radicals of the second precursor. After the reaction with the substrate surfaces, the vacuum system removes a second outflow from the reaction chamber. The second outflow removes substantially all of the second precursor from the reaction chamber without passing the second outflow through the trap. However most or all of the free radicals of the second outflow may have decayed to a lower energy state before exiting the reaction chamber.

The vacuum system includes a main vacuum pump in fluid communication with the reaction chamber through a vacuum flange that interfaces with the reaction chamber. A first vacuum conduit extends from the vacuum flange to the main vacuum pump and the trap is disposed along the first vacuum conduit such that gases flowing through the first vacuum conduit pass through the trap. A controllable first vacuum valve is disposed along the first vacuum conduit between the vacuum flange and the trap. A second turbo vacuum pump is interfaced with the vacuum flange to achieve lower vacuum pressures in the reaction chamber, especially for plasma enhanced atomic layer deposition and to remove outflow from the reaction chamber. A second vacuum conduit extends between the turbo vacuum pump and the main vacuum pump without passing through the trap. A second vacuum valve is disposed along the second vacuum conduit between the turbo vacuum pump and the main vacuum pump. The main vacuum pump is a roughing pump operable to pump the reaction chamber to a vacuum pressure of about 10 millitorr. The second turbo vacuum pump is a finishing pump capable of pumping the reaction chamber to a vacuum pressure of about 1.0 μtorr.

BRIEF DESCRIPTION OF THE DRAWING

The features of the present invention will best be understood from a detailed description of the invention and example embodiments thereof selected for the purposes of illustration and shown in the accompanying drawing in which:

FIG. 1 depicts an exemplary schematic diagram of a PEALD system according to the present invention.

DESCRIPTION OF EMBODIMENTS OF THE INVENTION

Overview

The present invention describes a non-limited exemplary embodiment of a Plasma Enhanced Atomic Layer Deposition (PEALD) system and related operating methods as well as substrates coated by the described methods. In particular the system includes a reaction chamber suitable for thin film growth onto exposed surfaces of substrates positioned inside the reaction chamber. The reaction chamber is a vacuum chamber pumped to vacuum pressures by two different vacuum pumps. Each vacuum pump is connected to the vacuum chamber through a different exit port and a different vacuum conduit path. In particular different outflow lines and or fore lines are associated with each vacuum pump and each separate vacuum conduit path includes one or more valves that are operable by an electronic controller to modify and redirect gas outflow from the reaction chamber to flow out of the system along different vacuum conduit paths. In particular a first vacuum conduit path used to remove and trap non-plasma precursors includes a conventional ALD trap; however a second vacuum conduit path used to remove plasma precursors does not include a trap. As a result only the first precursor enters the ALD trap. However the present invention includes an alternate second precursor source which delivers a second precursor, e.g. water vapor, into the ALD trap in order to complete an ALD reaction with exposed surfaces of a trap material disposed inside a trap chamber. Thus the alternate second precursor source of the present invention is used to continue to prepare exposed trap material surfaces inside the trap for reaction with the first precursor on the next ALD coating cycle. A non-limiting example PEALD reaction chamber suitable for use with the present invention is disclosed in US20100183825A1, by Becker et al. published on Jul. 22, 2010, entitled PLASMA ATOMIC LAYER DEPOSITION SYSTEM AND METHOD which is incorporated herein in its entirety for all purposes.

Definitions

The following definitions are used throughout, unless specifically indicated otherwise:

| TERM | DEFINITION |
| --- | --- |
| PEALD | Plasma Enhanced Atomic Layer Deposition |
| ALD | Atomic Layer Deposition |
| PLASMA | The fourth state of matter. A partially ionized gas mixture consisting of ions, capable of physically interacting with a solid surface, free radicals and neutral byproducts, capable of chemically reacting with a solid surface and photons. |
| FREE RADICAL | An atom or group of atoms containing at least one unpaired electron and existing for a brief period of time before reacting to produce a stable molecule |

Item Number List

The following item numbers are used throughout, unless specifically indicated otherwise.

| # | DESCRIPTION |
| --- | --- |
| 100 | PEALD system |
| 105 | Reaction chamber |
| 110 | Substrate |
| 115 | Substrate coating surface |
| 120 | Gas and precursor supply module |
| 125 | Electronic controller |
| 130 | First precursor port and conduit |
| 135 | Second precursor port and conduit |
| 140 | Plasma generator |
| 145 | Second pulse valve |
| 146 | Mass flow controller |
| 150 | First pulse valve |
| 155 | Main vacuum pump |
| 160 | Vacuum Flange |
| 165 | First vacuum conduit |
| 170 | First Vacuum valve |
| 175 | ALD trap |
| 180 | Turbo molecular vacuum pump |
| 185 | Vacuum gate valve |
| 190 | Second vacuum conduit |
| 195 | Second Vacuum valve |
| 196 | Pressure sensor |
| 198 | Trap heater |
| 200 | Alternate second precursor supply |
| 202 | Vaporizer |
| 205 | Valve |
| 210 | Inert gas Feed line |
| 211 | Inert gas inlet port |
| 215 | Valve |
| 220 | Valve |

Exemplary System Architecture

Referring now to FIG. 1 a non-limiting exemplary PEALD system (100) according to the present invention is depicted schematically. The PEALD system (100) includes a PEALD configured reaction chamber (105) housing a substrate (110) supported on a substrate support surface provided by a heated chuck (111). The substrate is supported in a coating position such that precursor vapors and or plasma free radical delivered into the reaction chamber impinge upon an upward facing coating surface (115). In other non-limiting exemplary embodiments the reaction chamber may support a plurality of substrates (110) on the support surface provided by the heated chuck (111) with each substrate having an upward facing coating surface (115) without deviating from the present invention.

Gas Supply Module

A gas and precursor supply module (120) includes a supply of various process vapors and gases stored in sealed canisters used to store liquid and solid precursor materials and or stored in pressurized gas cylinders used to store gas precursors such as reactive plasma gases including but not limited to $O_2$, $N_2$, $H_2$, $NH_3$ or the like, and gaseous first precursors as well as inert gases usable as carrier gases and or purge gases. The gas module (120) also includes controllable valves or mass flow regulators (145) and (150) operable by an electronic controller (125) to open, close or establish a desired mass flow rate of an input gas mixture as required to deliver selected precursors, carrier gases and or purge gases into the reaction chamber (105).

Liquid and gas precursor canisters may include a gas bubbler or other vaporizing device usable to vaporize or otherwise increase a vapor pressure of a precursor and/or to promote rapid vapor flow into the reaction chamber. The gas and precursor module (120) may further include other gas and vapor flow modulating elements controllable by the electronic controller (125) as required for mixing, directing and/or modulating precursor vapor material gleaned from a liquid or a solid precursor and/or the inert gas usable as a carrier gas and/or a purge gas or both.

In the present embodiment the gas and precursor supply module (120) further includes precursor heaters, not shown, provided to preheat precursor canisters or otherwise heat precursor materials as required to increase vapor pressure and deliver each precursor at a desired precursor temperature. In one non-limiting example embodiment precursors are heated to a temperature of about 70° C., preferably less than a thermal breakdown temperature of the precursor vapor. Additionally the gas and precursor module (120) may include one or more pressure regulators, mass flow regulators or flow restrictors and various pressure, temperature and flow rate sensors, or like, not shown, as needed to provide feedback signals to the electronic controller (125) and operate the PEALD system in a plurality of different operating modes including providing different precursor combinations as required for performing a plurality of different material coating cycles to coat one or more different substrate surface materials with one or more different solid material layers.

The non-limiting exemplary PEALD system (100) includes two precursor delivery paths as described below to the reaction chamber (105), however, one delivery path is usable without deviating from the present invention. A first precursor port and input conduit (130) delivers non-plasma precursors into the reaction chamber (105). The first precursor port and input conduit (130) is disposed at a position above the substrate coating surface (115) and the first precursor port and input conduit (130) is oriented at an angle that preferably directs the precursor input material at an input angle that causes the precursor input stream to impinge proximate to a center of the substrate coating surface (115) when the substrate (110) is supported by the substrate support surface provided by the heated chuck (111). A second precursor port and input conduit (135) passes through a plasma generator (140) which includes a plasma exciter tube, not shown, disposed inside the plasma generator (140). The plasma generator (140) is controlled by the electronic controller (125) to either excite the second precursor inside the plasma exciter tube; or not. Accordingly non-plasma precursors and or purge gas are also deliverable into the reaction chamber (105) through the second precursor port and input conduit (135) simply by not operating the plasma generator (140).

Each of the first precursor port and conduit (130) and the second precusor port and conduit (135) includes or is associated with a controllable gas modulation element such as a first pulse valve (150) for modulating the flow of the first precursor through the first precursor port and input conduit (130), a mass flow controller (146) for modulating the flow of a plasma precursor through the second precursor port and input conduit (135) and/or an optional second pulse valve (145). In a preferred embodiment each of the first pulse valve (150), the mass flow controller (146) and the optional second pulse valve (145) is housed inside the gas flow module (120) proximate to the precursor supply containers. However for clarity, FIG. 1 shows the first pulse valve (150) disposed along the first input precursor port and conduit (130) to modulate gas flow there through. The first precursor pulse valve (150) is controllable by the electronic controller (125) to open and close for a pulse duration corresponding with a desired volume of the first precursor gas selected to be delivered into the reaction chamber (105). In the case of the plasma precursor, for clarity, FIG. 1 shows the mass flow controller (146) disposed along the second precursor port and conduit (135), however it is preferably disposed inside the gas supply module (120). The mass flow controller (146) is used to modulate a mass flow rate of plasma gas precursor passing through the input second precursor port and conduit (135) in order to deliver a desired mass flow rate of plasma precursor selected to be delivered into the reaction chamber (105). The mass flow controller (146) is controllable by the electronic controller (125) and is operable to alter a mass flow rate of a gas passing there through.

The PEALD system (100) may further include an optional second pulse valve (145) controllable by the electronic controller (125). The second pulse valve (145) is usable to preform thermal ALD deposition cycles using a non-plasma second precursor to react with exposed surfaces of the substrate (110). During thermal ALD deposition cycles the mass flow controller (146) is not used to modulate the mass flow rate of the second precursor. Instead the optional second pulse valve (145) is controllable by the electronic controller (125) to open and close for a pulse duration corresponding with a desired volume of the second precursor gas selected to be delivered into the reaction chamber (105).

As depicted in FIG. 1 the optional second pulse valve (145) is shown associated with the second precursor port and input conduit (135) to emphasis that a second non-plasma precursor can by delivered into the reaction chamber (105) through the second precursor port and input conduit (135), however it is preferred that the optional second pulse valve (145) is disposed inside the gas and precursor supply module (120). Alternately the optional second pulse valve (145) can be associated with the first precursor port and input conduit (130) to deliver a second, non-plasma precursor into the reaction chamber (105) through the first precursor port and input conduit (130). Thus in one optional thermal ALD operating embodiment a first non-plasma precursor is delivered into the reaction chamber (105) through the first precursor port and input conduit (130) and modulated by the first pulse valve (150); and, a second non-plasma precursor is delivered into the reaction chamber (105) through the second precursor port and conduit (135) and modulated by the optional second pulse valve (145) without plasma excitement.

In another optional thermal ALD embodiment, a first non-plasma precursor is delivered into the reaction chamber (105) through the first precursor port and input conduit (130) and modulated by the first pulse valve (150); and, a second non-plasma precursor is delivered into the reaction chamber (105) through the first precursor port and conduit (130) and modulated by the optional second pulse valve (145). In one non-limiting example embodiment the pulse durations of the first pulse valve (150) and the optional second pulse valve (145) range between 1 and 15 msec. Additionally the pulse valve duration of each first and second pulse valves (150) and (145) is independently controllable either by the electronic controller (125), by user input or by mechanical adjustment of the pulse valves (150) and (145).

Each of second and first pulse valves (145) and (150) and the mass flow controller (146) may include an inert gas inlet port (211) connected to an inert gas feed line (210). The inert gas inlet port (211) provided on each of the second and first pulse valves (145) and (150) and on the mass flow controller (146) receives inert gas from the inert gas feed line (210) and delivers the inert gas into the reaction chamber (105) through a corresponding one of the first precursor port and conduit (130) or the second precursor port and conduit (135). In a preferred embodiment the inert gas inlet ports (211) are always open thereby allowing a continuous flow of inert gas to pass through each inert gas port (211) to the reaction chamber (105). In other embodiments the first pulse valve (150) and the second pulse valve (145) are operable to close the corresponding inert gas ports (211) except when the corresponding pulse valve is actuated by the control module (125). In either case the inert gas entering through the inert gas inlet ports (211) mixes with precursor flowing to the reaction chamber (105).

Vacuum System

The non-limiting exemplary PEALD system (100) includes a main vacuum pump (155) and a turbo molecular vacuum pump (180) The main vacuum pump (155) is fluidly connected to a vacuum flange (160) by a first vacuum conduit (165) which extends between the vacuum flange (160) and the main vacuum pump (155). A first vacuum valve (170) is operable to open or close the first vacuum conduit (165) under the control of the electronic controller (125). A conventional ALD trap (175) is disposed along the first vacuum conduit (165) such that any outflow from the reaction chamber (105) that passes through the first vacuum conduit (165) also passes through the ALD trap (175) before reaching the main vacuum pump (155). In particular the ALD trap (175) includes a large internal material surface area, e.g. a plurality of closely spaced metal plates or foils, disposed inside a trap chamber or a flow conduit formed by the trap and the material of the large internal surface area is provided to react with any unreacted precursor contained in the outflow passing through the first vacuum conduit (165) to thereby substantially eliminate unreacted precursors from the outflow before the outflow reaches the main vacuum pump (155). In the present example embodiment the main vacuum pump (155) is a lower cost roughing pump capable of pumping the reaction chamber to about 10 millitorr, ($10^{-2}$ Torr).

The turbo molecular vacuum pump (180) is fluidly connected to the vacuum flange (160) through a vacuum gate valve (185). The turbo molecular vacuum pump (180) withdraws outflow from the reaction chamber (105) when the vacuum gate valve (185) is opened. The turbo molecular vacuum pump (180) operates to provide lower vacuum pressures in the reaction chamber (105) than can be provided by the main vacuum pump (155). The lower pressures tend to improve the performance of plasma enhanced atomic layer deposition by improving delivery of the plasma exited second precursor to exposed the surface of the substrates. The vacuum gate valve (185) is operable by the electronic controller (125) to open and close a reaction chamber (105) exit port formed by the vacuum flange (160), and the reaction chamber (105) exit port associated with the turbo molecular pump (180) is considerably larger than an exit port passing through the vacuum flange (160) associated with its connection with the first vacuum conduit (165). As will be described further below the vacuum gate valve (185) is closed to remove a first outflow from the reaction chamber (105) through the ALD trap (175). A second vacuum conduit (190) or fore line extends from the turbo molecular vacuum pump (180) to the main vacuum pump (155) via second vacuum conduit (190) that includes a second vacuum valve (195) operable to open or close the second vacuum conduit (190) under the control of the electronic controller (125). In the present example embodiment the turbo molecular vacuum pump (180) is a higher cost finishing pump capable of pumping the reaction chamber to about 1.0 µtorr, ($10^{-6}$ Torr). Additionally as compared to conventional PEALD systems the turbo molecular vacuum pump (180) does not draw vacuum through a trap which therefore renders the turbo molecular vacuum pump (180) of the present invention more efficient than conventional PEALD vacuum systems that draw vacuum through a trap. Moreover as will be further detailed below according to one aspect of the present invention, the first precursor never passes through the turbo molecular vacuum pump (180) and this allows the use of a lower cost turbo molecular vacuum pump (180) that does not have to be configured to operate in a precursor contaminated environment.

Operating Modes

The non-limiting exemplary PEALD system (100) is operable to automatically deposit a plurality of material layers onto exposed surfaces of the substrate or substrates (110) and particularly onto the substrate coating surface (115). A single layer deposition cycle refers to depositing a single layer of the deposition material onto the substrate (110). A coating run or coating process refers to a plurality of deposition cycles. In one non-limiting example coating run a plurality of deposition cycles is performed using the same coating material depositing many single layers of the same deposition material onto the substrate (110) until a desired coating thickness or number of individual material layers is achieved. In a second non-limiting example coating run or process a plurality of first deposition cycles is performed to deposit a plurality of layer thicknesses of a first deposition material onto the coating surface. Thereafter the PEALD system (100) is automatically reconfigured to perform a plurality of second deposition cycles performed to deposit a plurality of layer thicknesses of a second deposition material onto the coating surface over the layers of first deposition material. At the end of a coating run or process the substrate (110) is removed and replaced with another uncoated substrate. In various chamber embodiments a plurality of substrates may be supported for coating and all of the substrates (110) may be coated by the coating run or process.

As described above a single layer deposition cycle includes four basic steps, 1) exposing the coating surface to a first precursor, 2) purging the first precursor from the reaction chamber (105), 3) exposing the coating surface to a second precursor, and 4) purging the second precursor from the reaction chamber (105). In conventional thermal ALD and PEALD systems, a single turbo vacuum pump operates continuously to remove outflow from the reaction chamber and to draw the entire outflow through an ALD trap. In the specific case of any PEALD system, the second precursor is a plasma precursor comprising high energy radicals.

According to one non-limiting operating embodiment of the present invention only the outflow from steps 1 and 2 above, where the outflow contains the first precursor is drawn through the ALD trap (175) by the main vacuum pump (155) and this is performed by closing the vacuum gate valve (185) to exclusively draw outflow from the reaction chamber (105) through the main vacuum pump (155). Otherwise during steps 3 and 4 where the outflow contains a plasma precursor the outflow is not drawn through the ALD trap (175), however, instead is drawn out of the reaction chamber (105) by the turbo molecular vacuum pump (180) and then exhausted out of the system by the main vacuum pump (155) when both pumps are operating simultaneously. Specifically during steps 3 and 4 the vacuum gate valve (185) is opened and the first vacuum valve (170) is closed. Moreover the outflow that contains the plasma precursor is not passed through a trap at all since the plasma radicals tend to decay quickly enough that they are essentially non-reactive by the time they reach the vacuum flange (160).

The process steps associated with the improved operation of the present invention are as follows: 1) exposing the coating surface (115) to a first precursor delivered through the first precursor port and input conduit (130); and, 2) purging the first precursor from the reaction chamber (105) while the vacuum gate valve (185) and the second vacuum valve (195) are closed and the first vacuum valve (170) is opened so that all outflow exiting from the vacuum flange (160) is diverted to the first vacuum conduit (165) and drawn through the ALD trap (175). Specifically, the first non-plasma precursor is directed through the ALD trap (175) and this causes surfaces of a trap material disposed within the ALD trap (175) to react with and remove unreacted first precursor from the outflow. It also results in a pressure increase and a reduced vapor flow rate through the reaction chamber (105) since during the first precursor exposure step the outflow is being drawn out of the reaction chamber (105) exclusively by the main vacuum pump (155) pulling through the ALD trap (175). After passing through the main vacuum pump (155) the outflow from the first vacuum conduit (165) is vented to an exhaust.

After 1) exposing the coating surface (115) to a first precursor; and, 2) purging the first precursor from the reaction chamber (105) while the vacuum gate valve (185) and the second vacuum valve (195) are opened and the first vacuum valve (170) is closed so that all outflow from the reaction chamber (105) is diverted through the turbo molecular vacuum pump (180) and then through the second vacuum conduit (190) through the main vacuum pump (155) to the exhaust vent. Thus during the second precursor exposure step no trap is used to trap unreacted precursor because by the time the plasma precursor radicals reach the vacuum flange (160) substantially all of the highly reactive radical material has either reacted with surfaces inside the reaction chamber or decayed to a non-reactive state. Thus Applicant have found that in the case of a the plasma precursor, since there is substantially no unreacted plasma precursor remaining in the outflow from the reaction chamber the outflow exiting from the reaction chamber resulting from the plasma precursor exposure of steps 3 and 4 can be pumped through the turbo molecular vacuum pump (180) without damaging the turbo molecular vacuum pump (180) and can eventually be vented to exhaust by the main vacuum pump (155). Moreover, due to the configuration of the present invention even if there was unreacted plasma precursor in the outflow passing through the turbo molecular vacuum pump (180) since the pump was not exposed to the first precursor in steps 1 and 2 surfaces of the turbo molecular vacuum pump (180) are not prepared for a reaction with the second precursor and therefore no detrimental, film depositing reaction occurs on inside surfaces of the turbo molecular vacuum pump (180) or on inside surfaces of the second vacuum conduit (190), thus enabling the use of less expensive turbo pumps.

Second Precursor Source

While the above described vacuum system improves the pumping efficiency of the turbo molecular vacuum pump (180) and allows a lower cost turbo vacuum pump to be used due to low risk of contamination, the two vacuum pump vacuum system does not allow continued first precursor removal by the ALD trap (175) without the addition of an alternate second precursor supply (200) provided to inject a second precursor into the ALD trap (175). Specifically, as described above, the first precursor is removed from outflow passing through the first vacuum conduit (165) by the ALD trap (175). This occurs when the first precursor reacts with trap material surfaces and is removed from the outflow. Additionally the same reaction that removes the first precursor from the outflow prepares the trap material surfaces for reaction with the second precursor while also rendering the trap material surfaces non-reactive with the first precursor. As a result on subsequent deposition cycles where only the first precursor passes through the first vacuum conduit (165) and the ALD trap (175) no further first precursor will be removed from the outflows because no second precursor flows to the ALD trap (175) to complete the reaction between the now reactive trap material surfaces inside the trap and the second precursor. Accordingly the alternate second precursor supply (200) is provided as described below.

The present invention includes an alternate second precursor supply module (200) filled with a supply of one or more suitable second precursors for completing a reaction with the trap material surfaces inside the ALD trap (175) when the second precursor is delivered into the ALD trap (175). In particular, the second precursor supply module (200) is operable to inject a second precursor vapor into the ALD trap (175) and the second precursor reacts with the trap material surfaces to complete the ALD reaction started by the first precursor. Thus the reaction between the second precursor and the trap surfaces forms a material layer on the trap material surfaces while also preparing the trap material surfaces to react with the first precursor on the next deposition cycle.

In one non-limiting example embodiment, the alternate second precursor supply module (200) comprises a source of water vapor ($H_2O$). The alternate second precursor supply module (200) is configured to deliver the alternate second precursor into the ALD trap (175) through a controllable valve (205) which is operated by the electronic controller (125). The valve (205) is opened to release the alternate second precursor into the first vacuum conduit (165) at a position between the first vacuum valve (170) and theALD trap (175). While the valve (205) is opened, preferably the first vacuum valve (170) closed in order to prevent the alternate second precursor from contaminating the reaction chamber (105). Additionally while the valve (205) is opened, the main vacuum pump (155) is operating thereby drawing outflow through the first vacuum conduit (165) and drawing alternate second precursor through the ALD trap (175).

The alternate second precursor supply module (200) is preferably configured to mix the alternate second precursor with an inert carrier gas, e.g. nitrogen, or argon, received from the gas and alternate second precursor supply module (120) over inert gas feed line (210) that mates with the first vacuum conduit (165) at a position located between the first vacuum valve (170) and the ALD trap (175). A controllable valve (215), or other gas flow modulating element, is disposed along the inert gas feed line (210) between the gas and precursor supply module (120) and the first vacuum conduit (165) to modulate the carrier gas flow.

The alternate second precursor supply module (200) may include a bubbler or vaporizer (202) operable to vaporize or increase the vapor pressure of the alternate second precursor, if needed. Additionally the alternate second precursor supply (200) may house a plurality of different alternate second precursors stored in different precursor containers for use with different deposition chemistries as may be required. Preferably, each alternate precursor container includes one or more gas flow control elements operable by the electronic controller (125) to select an alternate second precursor matched to the first precursor of the particular deposition chemistry being used and deliver the selected alternate second precursor into the ALD trap (175) at appropriate periods of each gas deposition cycle. Additionally the alternate second precursor supply module (200) may comprise a portion of and be housed inside the gas and precursor module (120). In this configuration the alternate second precursor maybe mixed with an inert carrier gas at the gas and precursor supply module (120) and the mixture is delivered to the ALD trap (175) through the inert gas feed line (210) and modulated by the valve (215) without deviating from the present invention.

In operation during the first two steps of a deposition cycle; 1) exposing the coating surface (115) to a first non-plasma precursor; and, 2) purging the first precursor non-plasma from the reaction chamber (105), the first vacuum valve (170) is open and the vacuum gate valve (185) and the second vacuum valve (195) are closed. This allows the first precursor outflow to pass through the ALD trap (175) and out of the system to an exhaust through the main vacuum pump (155) without passing through the second turbo molecular vacuum pump (180). Meanwhile any unreacted first precursor is removed from the outflow by reacting with trap material surfaces provided inside the ALD trap (175).

During the third and fourth steps of the deposition cycle; 3) exposing the coating surface (115) to a second (plasma) precursor, and, 4) purging the second (plasma) precursor from the reaction chamber (105), the first vacuum valve (170) is closed and the vacuum gate valve (185) and second vacuum valve (195) are opened. This allows the second precursor outflow to pass through the turbo molecular vacuum pump (180) and then through the second vacuum conduit (190) and out of the system to an exhaust vent through the main vacuum pump (155). Alternately, the second vacuum conduit (190) can be configure to vent exhaust materials removed from the reaction chamber (105) directly to an exhaust vent without passing through the main vacuum pump (155), without deviating from the present invention. Meanwhile during steps 3) and 4) of the deposition cycle the valve (205) is opened to release the alternate opened to deliver second precursor into the ALD trap (175) to react with the trap material surfaces provided inside the trap and the valve (215) is also opened to provide inert carrier gas into the first vacuum conduit (165) in order to carry the alternate second precursor into the ALD trap (175). Alternately a continuous flow of inert gas may be flowed through inert gas feed line (210), without requiring the valve (215), (i.e. valve 215 can be deleted or retained open) without deviating from the present invention. In a further alternate embodiment the valve (215) may alternately comprise a mass flow controller, restrictor or other element suitable for modulating a gas flow rate there through.

Other optional elements include an operable or manual valve (220) usable to isolate the trap from the main vacuum pump (155) and one or more pressure sensing elements (196) readable by the electronic controller (125), disposed to sense gas pressure at various locations. Additionally, while the first and second vacuum conduits (165) and (190) are depicted connecting to the main vacuum pump (155) at two locations, this is just a schematic representation and actual configurations may differ without deviating from the present invention. In particular second vacuum conduit (190) may join the first vacuum conduit (165) between the ALD trap (175) and the main vacuum pump (155) with only the first vacuum conduit (165) connected to a single flange of the main vacuum pump (155).

Trap Configurations

The ALD trap assembly (175) comprises a conventional ALD trap or filter such as the one disclosed in U.S. Pat. No. 8,202,575, granted on Jun. 19, 2012 to Monsma et al. entitled VAPOR DEPOSITION SYSTEMS AND METHODS, filed on Jun. 27, 2005, which is incorporated herein by reference in its entirety. The ALD trap assembly (175) comprises a fluid flow conduit filled with a trap material. Ideally the ALD trap (175) assembly is configured to provide a small gas flow resistance and high vacuum conductance.

The ALD trap assembly (175) includes a trap heater (198) and associated temperature sensor, each in electrical communication with the electronic controller (125). The trap material composes a plurality of different elements or a single element formed with sufficient surface area to react with the first precursor and second precursor introduced therein for an extended operating period e.g. tens of thousands of deposition cycles. Over time, material layers built up on the trap surface area may degrade trap performance so the trap element can be removed and replaced as required to maintain good trap performance.

Preferably, the trap material surface area is heated to substantially the same temperature as the coating surface (115) in order to cause the first and second precursors to react with the trap material surface area and form the same material layers on the trap material surfaces as are being coated onto substrate surface (115) by the coating process being carried out in the gas deposition reaction chamber (105). During operation, the ALD trap (175) typically is maintained at an elevated temperature. In some embodiments (e.g., when the ALD trap (175) is positioned, at least in part, in the outlet port), the ALD trap (175) is heated to a sufficient temperature by thermal conductance from the reaction chamber (105) (which, for example, is heated by a tubular heater). Thus, in these embodiments, the ALD trap (175) does not need to have a separate heater (198).

While a metal trap material in various forms is preferred, other suitable trap materials may be used. Trap material forms include thin metal foils oriented with a high percentage of the surface area parallel to the gas flow direction to reduce gas flow resistance. Corrugated metal foils are also usable. When using foils substantially all (i.e., greater than 99%) of the surface area of the ALD trap (175) is parallel to the gas flow direction. The surface area of foil traps can be increased by increasing the length, diameter and corrugation of a corrugated or rolled foil element. A consideration in selecting an ALD trap (175) material is to match the coefficient of thermal expansion of the trap material to the coating material to avoid cracking and flaking the coating material inside the ALD trap (175). Accordingly the trap material may comprise foils of engineered metals such as kovar, invar and other heat and corrosion resistant alloys.

Other forms of trap material include metal wool or mesh screens comprising stainless steel, aluminum, or copper. Granular materials are also usable such as activated carbon and activated alumina; however these increase gas flow resistance. It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications (e.g. ALD and PEALD gas deposition systems), those skilled in the art will recognize that its usefulness is not limited thereto and that the present invention can be beneficially utilized in any number of environments and implementations where it is desirable to react unreacted precursors to remove them from an outflow. Accordingly, the claims set forth below should be construed in view of the full breadth and spirit of the invention as disclosed herein.

The invention claimed is:

1. An atomic layer deposition device for performing material deposition cycles comprising:
   a reaction chamber configured to support one or more substrates therein;
   a first precursor conduit and port provided to deliver a first precursor into the reaction chamber to react with exposed surfaces of the one or more substrates;
   a vacuum system configured to remove a first outflow from the reaction chamber
      wherein removing the first outflow removes substantially all of the unreacted first precursor from the reaction chamber;
   an ALD trap comprising trap material surfaces disposed to receive the first outflow there through wherein the trap material surfaces are suitable to react with and remove substantially all of the unreacted first precursor from the first outflow;
   a second precursor source in fluid communication with the ALD trap for delivering a second precursor into the ALD trap, the fluid communication bypassing the reaction chamber;
      wherein the second precursor comprises a material suitable for reacting with the trap material surfaces in a manner that renders the trap material surfaces suitable to react with the first precursor.

2. The atomic layer deposition device of claim 1 wherein the one or more substrates are maintained at a reaction temperature during the material deposition cycles, further comprising a trap heater and temperature sensing element in communication with an electronic controller wherein the trap heater and temperature sensor are operable to maintain the trap material surfaces at the reaction temperature.

3. The atomic layer deposition device of claim 1 wherein the trap material comprises one or more thin metal foils oriented with a high percentage of the foil surface area disposed parallel to a gas flow direction through the ALD trap.

4. The atomic layer deposition device of claim 1 further comprising:
   a second precursor conduit and port provided to deliver a second precursor into the reaction chamber to react with the exposed surfaces of the one or more substrates after the exposed surfaces have reacted with the first precursor;
   a plasma generator associated with the second precursor conduit and port for exciting the second precursor and generating free radicals of the second precursor;
      wherein the vacuum system removes a second outflow from the reaction chamber,
      wherein removing the second outflow removes substantially all of the second precursor from the reaction chamber without passing the second outflow through the ALD trap.

5. The atomic layer deposition device of claim 4 wherein the vacuum system comprises:
   a main vacuum pump in fluid communication with the reaction chamber through a vacuum flange;
   a first vacuum conduit disposed between the vacuum flange and the main vacuum pump wherein the ALD trap is disposed along the first vacuum conduit;
   a first vacuum valve disposed along the first vacuum conduit between the vacuum flange and the ALD trap.

6. The atomic layer deposition device of claim 5 further comprising:
   a turbo molecular vacuum pump in fluid communication with the reaction chamber through the vacuum flange;
   a vacuum gate valve disposed between the reaction chamber and the turbo molecular vacuum pump wherein the vacuum gate valve is operable to prevent or allow gas flow through the vacuum flange;
   a second vacuum conduit disposed between the turbo molecular vacuum pump and the main vacuum pump without passing through the ALD trap;
   a second vacuum valve disposed along the second vacuum conduit between the turbo molecular vacuum pump and the main vacuum pump.

7. The atomic layer deposition device of claim 6 wherein the main vacuum pump comprises a roughing pump capable of pumping the reaction chamber to a vacuum pressure of about 10 millitorr (1.3 Pascal) and the turbo molecular vacuum pump comprises a finishing pump capable of pumping the reaction chamber to a vacuum pressure of 1.0 µTorr (0.000133 Pascal).

8. The atomic layer deposition device of claim 1 wherein the fluid communication further comprises a controllable valve disposed along a fluid conduit extending between the second precursor source and the ALD trap.

9. The atomic layer deposition device of claim 1 further comprising an inert gas supply associated with the second precursor source for mixing the second precursor with an inert gas delivered by the inert gas supply.

10. The atomic layer deposition device of claim 4 further comprising:

a first controllable pulse valve operable to modulate a first precursor flow through the first precursor conduit and port;

a controllable mass flow controller operable to modulate a second precursor flow through the second precursor conduit and port;

a second controllable pulse valve operable to modulate the second precursor flow through the second precursor conduit and port; and an electronic controller operable to employ either the controllable mass flow controller or the second controllable pulse valve depending on whether or not the second precursor flow comprises a plasma precursor;

wherein the atomic layer deposition device is operable to perform a plasma enhanced atomic layer deposition cycle wherein the second precursor is excited by the plasma generator and only the first outflow is removed through the trap; and, wherein the atomic layer deposition device is operable to perform a thermal atomic layer deposition cycle wherein neither of the first or the second precursors is excited by the plasma generator and both of the first and second outflows are removed through the ALD trap.

* * * * *